(12) United States Patent
Zhuang et al.

(10) Patent No.: US 11,181,572 B2
(45) Date of Patent: Nov. 23, 2021

(54) WAFER PROBER TO FACILITATE TESTING OF A WAFER USING NANOSECOND PULSES

(71) Applicant: Lumentum Operations LLC, San Jose, CA (US)

(72) Inventors: Yuanzhen Zhuang, San Jose, CA (US); Lucas Morales, San Francisco, CA (US); Raman Srinivasan, Fremont, CA (US); Sean Burns, Menlo Park, CA (US); Siu Kwan Cheung, San Jose, CA (US); Tian Shi, Fremont, CA (US); Tao Li, Fremont, CA (US)

(73) Assignee: Lumentum Operations LLC, San Jose, CA (US)

( * ) Notice: Subject to any disclaimer, the term of this patent is extended or adjusted under 35 U.S.C. 154(b) by 0 days.

(21) Appl. No.: 16/917,124

(22) Filed: Jun. 30, 2020

(65) Prior Publication Data
US 2021/0325451 A1 Oct. 21, 2021

Related U.S. Application Data

(60) Provisional application No. 63/011,708, filed on Apr. 17, 2020.

(51) Int. Cl.
*G01R 31/28* (2006.01)

(52) U.S. Cl.
CPC ..... *G01R 31/2865* (2013.01); *G01R 31/2886* (2013.01)

(58) Field of Classification Search
CPC ...... G01R 1/04; G01R 1/0408; G01R 1/0433; G01R 1/0491; G01R 1/06744; G01R 1/073; G01R 1/07342; G01R 31/2601; G01R 31/2886; G01R 31/2887; G01R 31/2891
See application file for complete search history.

(56) References Cited

U.S. PATENT DOCUMENTS

| | | | | |
|---|---|---|---|---|
| 2005/0184741 A1* | 8/2005 | Sun | ..................... | G01R 31/2886 324/754.07 |
| 2008/0290882 A1* | 11/2008 | Rogers | ..................... | G01R 1/36 324/755.11 |

* cited by examiner

*Primary Examiner* — Tung X Nguyen
(74) *Attorney, Agent, or Firm* — Harrity & Harrity, LLP

(57) ABSTRACT

A wafer testing system may comprise a chuck, a wafer carrier, a cathode plate, and a probe card. The chuck may be configured to hold the wafer carrier. The wafer carrier may be configured to hold a wafer on a surface of the wafer carrier, wherein the surface of the wafer carrier comprises one or more contact features protruding from the surface of the wafer carrier. The cathode plate may be configured to provide an electrical connection between the wafer carrier and the probe card, wherein a portion of a surface of the cathode plate is configured to be disposed on the one or more contact features of the wafer carrier. The probe card may be configured to test, using one or more probes associated with the probe card, the wafer when the wafer is on the surface of the wafer carrier.

20 Claims, 6 Drawing Sheets

100

WAFER PROBER TO FACILITATE TESTING OF A WAFER USING NANOSECOND PULSES

RELATED APPLICATION

This application claims priority to U.S. Provisional Patent Application No. 63/011,708, entitled "CATHODE CONNECTION FOR WAFER PROBE," filed on Apr. 17, 2020, the content of which is incorporated by reference herein in its entirety.

TECHNICAL FIELD

The present disclosure relates generally to a wafer prober for testing wafers and to a wafer prober to facilitate testing of a wafer using high-current pulses in a nanosecond range.

BACKGROUND

A wafer prober tests integrated circuits included in a die of a wafer. The wafer prober may use a probe card that includes one or more probes that electrically contact the integrated circuits to test the integrated circuits (e.g., based on electrical and optical responses).

SUMMARY

According to some implementations, a wafer testing system may include a chuck configured to hold a wafer carrier; the wafer carrier configured to hold a wafer on a surface of the wafer carrier to allow the wafer to be tested by one or more probes associated with a probe card of the wafer testing system, wherein the surface of the wafer carrier comprises one or more contact features protruding from the surface of the wafer carrier; a cathode plate configured to provide an electrical connection between the wafer carrier and the probe card when the one or more probes associated with the probe card test the wafer, wherein a portion of a surface of the cathode plate is configured to be disposed on the one or more contact features of the wafer carrier when the one or more probes associated with the probe card test the wafer; and the probe card configured to test, using the one or more probes associated with the probe card, the wafer when the wafer is on the surface of the wafer carrier, wherein a portion of a surface of the probe card is disposed on a portion of an additional surface of the cathode plate.

According to some implementations, a wafer prober may include a wafer carrier, wherein the wafer carrier is configured to hold a wafer to be tested by the wafer prober on a surface of the wafer carrier, wherein the surface of the wafer carrier comprises one or more contact features protruding from the surface of the wafer carrier; a cathode plate, wherein the cathode plate is configured to be disposed on the one or more contact features of the wafer carrier when the wafer is tested, wherein the cathode plate includes one or more connectors that connect the cathode plate to a probe card; and the probe card, wherein the probe card is configured to test the wafer when the wafer is on the surface of the wafer carrier, wherein a driver of the probe card is electrically connected, when the wafer is to be tested, to the wafer carrier via the one or more contact features of the wafer carrier, the cathode plate, and the one or more connectors that connect the cathode plate to the driver of the probe card.

According to some implementations, a wafer testing apparatus may include a wafer carrier configured to hold a wafer on a surface of the wafer carrier to allow the wafer to be tested by a probe card, wherein the surface of the wafer carrier comprises one or more contact features protruding from the surface of the wafer carrier; and a cathode plate configured to provide an electrical connection between the wafer carrier and the probe card, wherein the cathode plate is configured to contact the one or more contact features of the wafer carrier when the wafer is to be tested by the probe card, wherein the cathode plate includes one or more electrical connectors configured to connect the cathode plate to the probe card, and wherein the wafer carrier is to be electrically connected to the probe card via the one or more contact features of the wafer carrier, the cathode plate, and the one or more electrical connectors when the cathode plate contacts the one or more contact features of the wafer carrier and the cathode plate connects to the probe card via the one or more electrical connectors.

DETAILED DESCRIPTION

Figure 1:
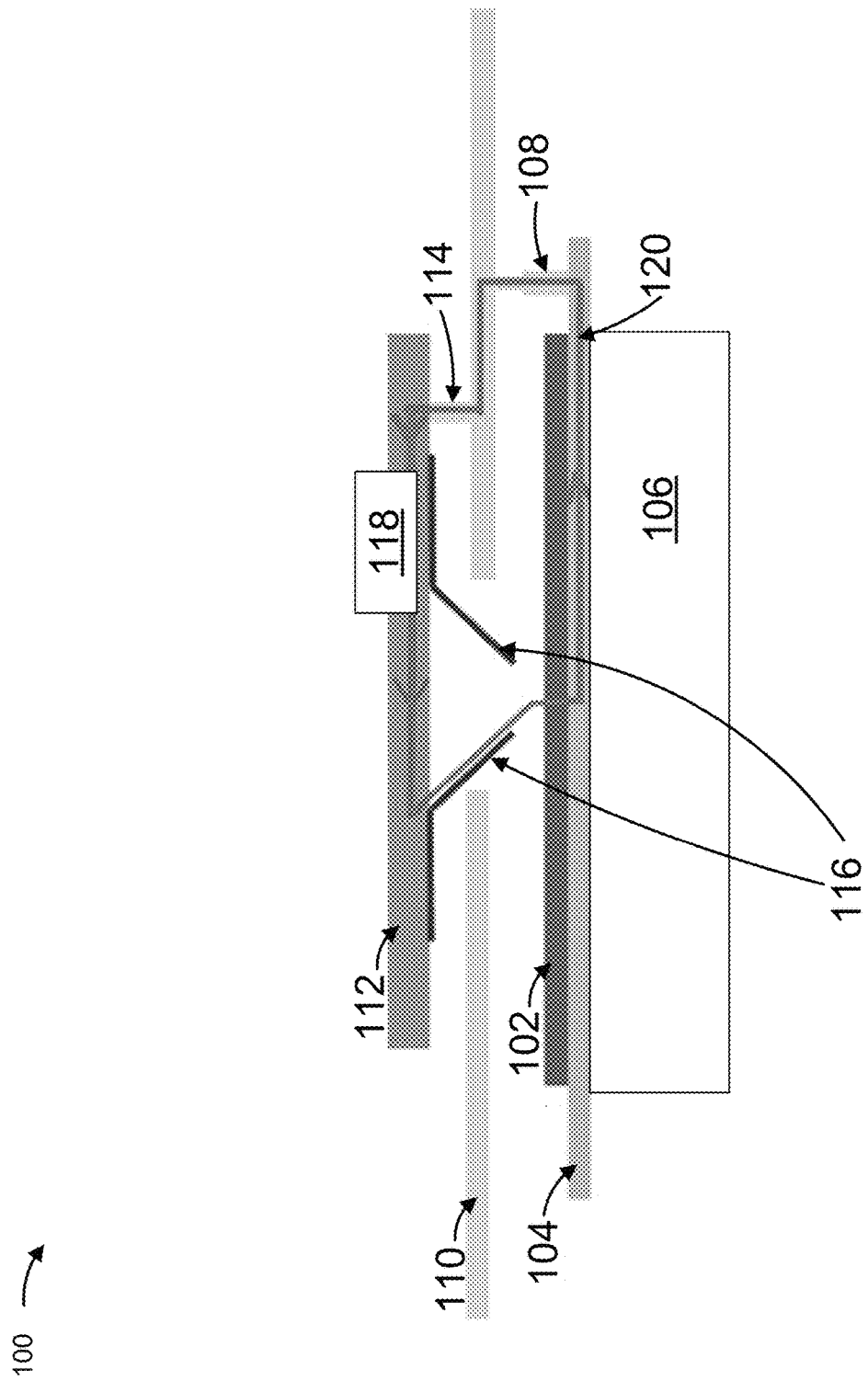
FIGS. 1-3 are diagrams of example wafer probers described herein.

The following detailed description of example implementations refers to the accompanying drawings. The same reference numbers in different drawings may identify the same or similar elements.

A wafer prober may include a chuck, a wafer carrier, and a probe card to test a wafer. The chuck may hold the wafer carrier and be configured to position the wafer for testing by the probe card. The wafer carrier may hold the wafer to allow one or more probes of the probe card to test integrated circuits of individual dies on the wafer. To test an integrated circuit of a die of the wafer, the probe card may generate an electrical pulse that transmits through a probe of the probe card to the integrated circuit. The pulse may propagate from the integrated circuit, to the wafer carrier, to the chuck, to an electrical connection cable, and back to the probe card (e.g., where the electrical pulse and/or any optical signal generated by the electrical pulse acting on the integrated circuit is analyzed to determine whether the integrated circuit is functioning correctly).

To effectively test the integrated circuit, the probe card needs to generate an electrical pulse with a high power level (e.g., a pulse with a high current level). In many cases, due to the high power level, the electrical pulse needs to have a short duration, to avoid overheating and/or damaging the integrated circuit. Typically, however, the electrical connection cable of the wafer prober is several meters long, which causes a path of transmission of the electrical pulse (e.g., from the pulse card back to the pulse card) to have a high amount of inductance. This may impede a rise of current that is needed by the probe card to generate the electrical pulse, which extends the pulse width of the electrical pulse. Due to these limitations, current probe cards are only able to generate electrical pulses with pulse widths in the microsecond range.

Some implementations described herein provide a wafer prober that includes a chuck, a wafer carrier, a cathode plate, and a probe card to test a wafer. The wafer carrier may be configured to hold the wafer, and the chuck may be configured to hold the wafer carrier and move the wafer to a position to allow the wafer to be tested by the probe card. The wafer carrier may include one or more contact features protruding from the surface of the wafer carrier that are configured to contact the cathode plate when the wafer is tested by the probe card. The cathode plate may provide an electrical connection between the wafer carrier and the probe card when the wafer is tested by the probe card, thereby eliminating a need for an electrical connection cable.

In some implementations, the probe card may be configured to test the wafer using one or more probes associated with the probe card. The probe card may generate (e.g., using a driver) an electrical pulse that transmits along a transmission path from the probe card, to a probe of the probe card, to a die of the wafer, to the wafer carrier, to the one or more contact features of the wafer carrier, to the cathode plate, and to the probe card.

In this way, some implementations described herein provide an electrical connection from the wafer carrier to the probe card via the cathode plate, and thereby reduce an overall length of the transmission path of the electrical pulse generated by the probe card (e.g., as compared to a length of a transmission path associated with using an electrical connection cable). Therefore, an amount of inductance associated with the path of transmission of the electrical pulse is reduced (e.g., as compared to amount of inductance associated with using an electrical connection cable). Accordingly, the probe card is able generate electrical pulses with pulse widths in the sub-microsecond range (e.g., in the nanosecond range). This may allow the wafer prober described herein to use nanosecond electrical pulses to test integrated circuits of a die on a wafer without heating or damaging the integrated circuits. Moreover, due to the decrease in pulse width, the wafer prober may be able to more efficiently test the integrated circuits (e.g., test more integrated circuits in a similar amount of time).

FIG. 1 is a diagram of a cross-sectional view of an example implementation of a wafer prober 100 (e.g., a wafer testing system or apparatus) configured to test a wafer 102. The wafer 102 may include a plurality of dies, where each die comprises a set of integrated circuits. The wafer prober 100 may be configured to test the respective sets of integrated circuits of each die of the wafer (e.g., as further described herein). As shown in FIG. 1, when the wafer prober 100 is to test the wafer 102, the wafer 102 may be disposed on a wafer carrier 104 of the wafer prober 100. The wafer carrier 104 may be configured to hold the wafer 102 during testing of the wafer 102. For example, the wafer carrier 104 may include one or more vacuum holes to allow the wafer 102 to be vacuum-mounted to the wafer carrier 104 while the wafer 102 is tested. As another example, the wafer 102 may be mounted to the wafer carrier 104 using tape, one or more clamps, or any other type of connector. This may cause the wafer 102 to be held in place during testing, which may prevent one or more dies of the wafer 102 from being damaged during testing.

The wafer 102 may have a circular shape, a polygonal shape, or any other type of shape. The wafer carrier 104 may have a circular shape, a polygonal shape, or any other type of shape to hold the wafer 102. The wafer carrier 104 may be larger in circumference, radius, diameter, area, perimeter, and/or the like than the wafer 102 (e.g., to allow the wafer 102 to be completely disposed on the wafer carrier 104 without the wafer 102 overhanging an edge of the wafer carrier 104). As shown in FIG. 1, when the wafer 102 is to be tested, a bottom surface of the wafer 102 may be disposed on a top surface of the wafer carrier 104. The bottom surface of the wafer 102 may be disposed directly on the top surface of the wafer carrier 104, or one or more intermediary materials may be disposed between the bottom surface of the wafer 102 and the wafer carrier 104.

As further shown in FIG. 1, the wafer carrier 104 may be disposed on a chuck 106 of the wafer prober 100. The chuck 106 may be configured to hold the wafer carrier 104 (e.g., while the wafer carrier 104 is holding the wafer 102 during testing of the wafer 102). Additionally, or alternatively, the chuck may be configured to move laterally and/or vertically to allow the wafer 102, when held by the wafer carrier 104, to be positioned so that the one or more dies of the wafer 102 may be tested (e.g., as further described herein).

In some implementations, the wafer carrier 104 may be mounted to the chuck 106 (e.g., via one or more mechanical connectors, one or more electrical connectors, an adhesive, and/or the like). The chuck 106 may have a circular shape, a polygonal shape, or any other type of shape to hold the wafer carrier 104. As shown in FIG. 1, a bottom surface of the wafer carrier 104 may be disposed on a top surface of the chuck 106. The bottom surface of the wafer carrier 104 may be disposed directly on the top surface of the chuck 106, or one or more intermediary materials may be disposed between the bottom surface of the wafer carrier 104 and the chuck 106.

As further shown in FIG. 1, the wafer carrier 104 may include one or more contact features 108 (e.g., as further described herein) that extend from a surface of the wafer carrier 104. For example, as shown in FIG. 1, the wafer carrier 104 may include a contact feature 108 that protrudes from the top surface of the wafer carrier 104 (e.g., at a 90 degree angle, or any other suitable angle, to the top surface of the wafer carrier 104). The one or more contact features 108 may be configured to electrically connect the wafer carrier 104 to a cathode plate 110 of the wafer prober 100.

As further shown in FIG. 1, the cathode plate 110 may be configured to be disposed on the one or more contact features 108 of the wafer carrier 104. For example, when the chuck 106 lifts the wafer 102, which is held by the wafer carrier 104, to allow the wafer 102 to be tested (e.g., as further described herein), the one or more contact features 108 of the wafer carrier 104 may contact the cathode plate 110, which may cause the cathode plate 110 to be disposed on the one or more contact features 108. As shown in FIG. 1, a bottom surface of the cathode plate 110 may be disposed on a top surface of the one or more contact features 108 of the wafer carrier 104 when the cathode plate 110 contacts the one or more contact features 108. The bottom surface of the cathode plate 110 may be disposed directly on the top surface of the one or more contact features 108, or one or more intermediary materials (e.g., one or more electrically conductive materials) may be disposed between the bottom surface of the cathode plate 110 and the one or more contact features 108.

In some implementations, the cathode plate 110 may be configured to electrically connect the wafer carrier 104 to a probe card 112 of the wafer prober 100 when the cathode plate 110 contacts the one or more contact features 108. In some implementations, the cathode plate 110 may have a circular shape, a polygonal shape, or any other type of shape to allow an electrical connection to be formed between the wafer carrier 104 and the probe card 112 (e.g., when the cathode plate 110 contacts the one or more contact features 108 of the wafer carrier 104).

In some implementations, the cathode plate 110 may include one or more contact features 114 that extend from a surface of the cathode plate 110 (e.g., similar to the one or more contact features 108 of the wafer carrier 104). For example, as shown in FIG. 1, the cathode plate 110 may include a contact feature 114 that protrudes from the top surface of the cathode plate 110 (e.g., at a 90 degree angle to the top surface of the cathode plate 110). The one or more contact features 114 may be configured to electrically connect the cathode plate 110 to the probe card 112.

As further shown in FIG. 1, the probe card 112 may be disposed on the one or more one or more contact features 114 of the cathode plate 110. The probe card 112 may be configured to test one or more dies of the wafer 102 when the wafer 102 is disposed on the wafer carrier 104 and positioned to be tested by the chuck 106. The probe card 112 may have a circular shape, a polygonal shape, or any other type of shape to allow the probe card 112 to test the wafer 102. As shown in FIG. 1, a bottom surface of the probe card 112 may be disposed on a top surface of the one or more contact features 114 of the cathode plate 110. The bottom surface of the probe card 112 may be disposed directly on the top surface of the one or more contact features 114, or one or more intermediary materials (e.g., one or more electrically conductive materials) may be disposed between the bottom surface of the cathode probe card 112 and the one or more contact features 114.

Alternatively, when the cathode plate 110 does not include one or more contact features 114, the bottom surface of the probe card 112 may be disposed directly on the top surface of the cathode plate 110. In some implementations, the probe card 112 may be mounted to the cathode plate 110 (e.g., via one or more mechanical connectors, one or more electrical connectors, an adhesive, and/or the like).

As further shown in FIG. 1, the probe card 112 may comprise one or more probes 116 configured to test individual dies of the wafer 102. For example, a probe 116 may be configured to test a set of integrated circuits included in a die of the wafer 102 by applying one or more electrical pulses to the set of integrated circuits. A probe 116 may be able to apply an electrical pulse to an integrated circuit when the chuck 106 positions the wafer 102 to allow a tip of the probe 116 to electrically touch a particular integrated circuit of a die of the wafer 102. In some implementations, the cathode plate 110 may include one or more openings to allow the one or more probes 116 of the probe card 112 access to the wafer 102 when the wafer 102, which is disposed on the wafer carrier 104, is positioned by the chuck 106 for testing.

As further shown in FIG. 1, the probe card 112 may include a driver 118 (e.g., an electrical driver circuit). The driver 118 may be configured to generate electrical pulses that transmit to the one or more probes 116 to allow the one or more probes 116 to test the dies of the wafer 102. In some implementations, the driver 118 may be configured to generate an electrical pulse with a nanosecond pulse width, with a current that satisfies (e.g., is greater than or equal to) a particular current threshold, with a power that satisfies (e.g., is greater than or equal to) a particular power threshold, and/or the like.

As shown in FIG. 1, a transmission path 120 for an electrical pulse may include the electrical pulse transmitting from the driver 118, to the probe card 112, to a probe 116 of the one or more probes 116, to a die of the wafer 102, to the wafer carrier 104, to the one or more contact features 108 of the wafer carrier 104, to the cathode plate 110, to the one or more contact features 114 of the cathode plate 110, to the probe card 112, and/or to the driver 118. The driver 118 (or another device associated with the driver 118) may be configured to, upon receiving the electrical pulse after the electrical pulse has traversed the transmission path 120, determine whether a particular integrated circuit of the die of the wafer 102 is functioning correctly.

As indicated above, FIG. 1 is provided merely as an example. Other examples may differ from what is described with regard to FIG. 1.

Figure 2:
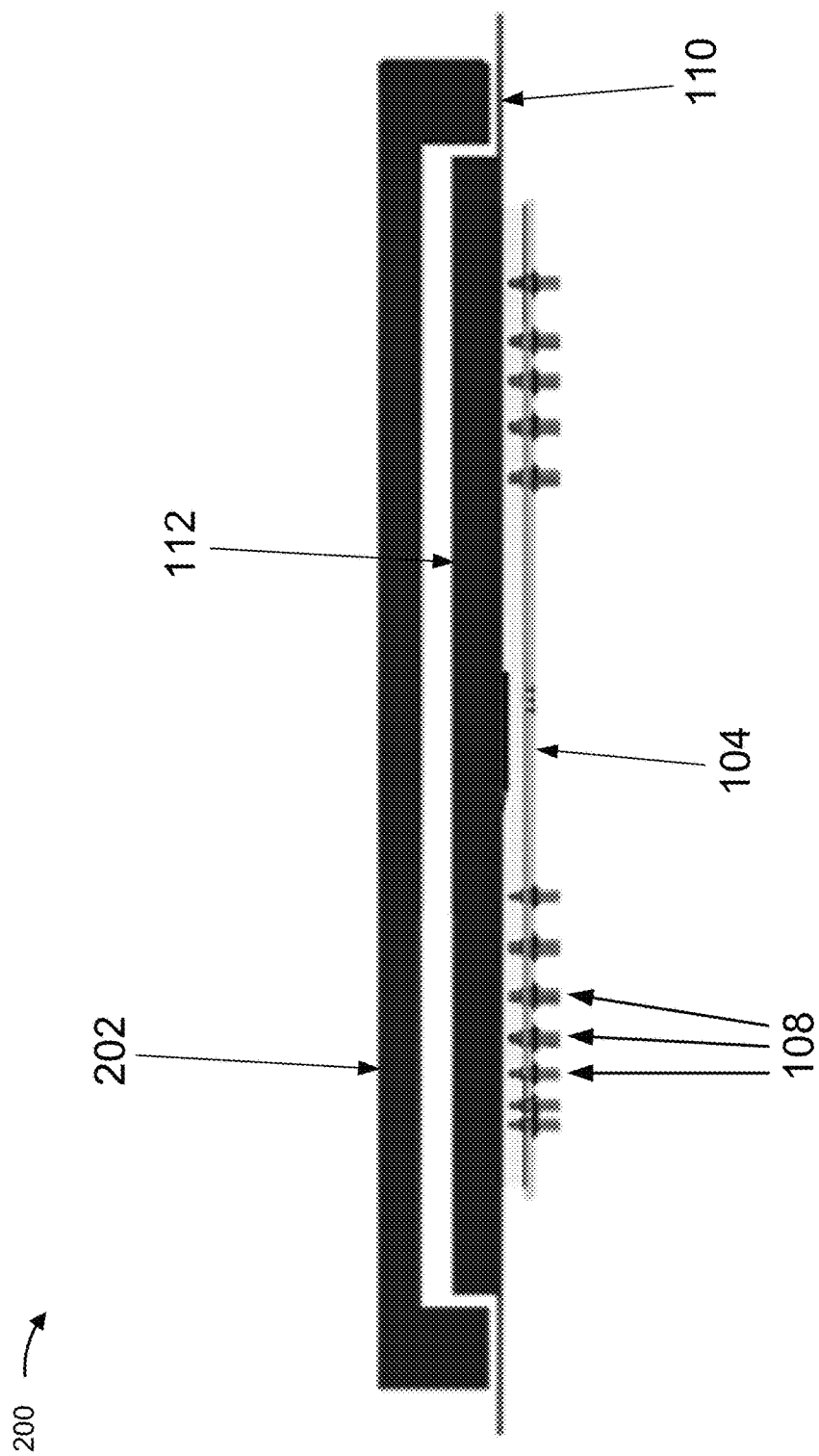

FIG. 2 is a diagram of a cross-sectional view of an example implementation of a wafer prober 200 (e.g., a wafer testing system or apparatus) configured to test a wafer 102. As shown in FIG. 2, the wafer prober 200 may include a wafer carrier 104 (that may be disposed on a chuck 106, not shown) that includes one or more contact features 108, a cathode plate 110 configured to be disposed on the one or more contact features 108 of the wafer carrier 104 (e.g., when the chuck 106 lifts the wafer 102 to be tested), a probe card 112 disposed on the cathode plate 110, and a probe card bracket 202 that is configured to protect the probe card 112 and/or attach the probe card 112 to the cathode plate 110.

As shown in FIG. 2, the one or more contact features 108 of the wafer carrier 104 may include one or more contact pins, such as one or more pogo pins (e.g., one or more spring-loaded electrical connectors), to provide an electrical connection between the wafer carrier 104 and the cathode plate 110. A pogo pin may be used as a contact feature 108 to withstand mechanical shocks and vibrations due to movement of the wafer carrier 104 and repeated contact of the contact feature 108 and the cathode plate 110 during testing of the wafer 102. While pogo pins are shown in FIG. 2, implementations may include a contact feature 108 comprising any other type of compliant and/or resilient electrical connector, such as a conductive elastomer. In some implementations, the contact feature 108 may be a circular contact connector, a polygonal contact connector, or any other shaped contact connector.

As further shown in FIG. 2, the one or more contact features 108 provide one or more electrical paths from the wafer carrier 104 to the probe card 112 via the cathode plate 110. For example, a unique electrical path may start from each contact feature 108, pass along the cathode plate 110, and end in the probe card 112. In some implementations, an inductance value associated with an electrical path, of the one or more electrical paths, may satisfy (e.g., be less than) an inductance threshold. Additionally, or alternatively, an overall inductance value associated with the one or more electrical paths may satisfy (e.g., be less than) an overall inductance threshold. In this way, the wafer carrier 104 may be electrically connected to the probe card 112 via a low inductance electrical connection, which may facilitate the probe card 112 being able to generate nanosecond pulses with high current, high power, and/or the like to test the wafer 102.

As indicated above, FIG. 2 is provided merely as an example. Other examples may differ from what is described with regard to FIG. 2.

Figure 3:
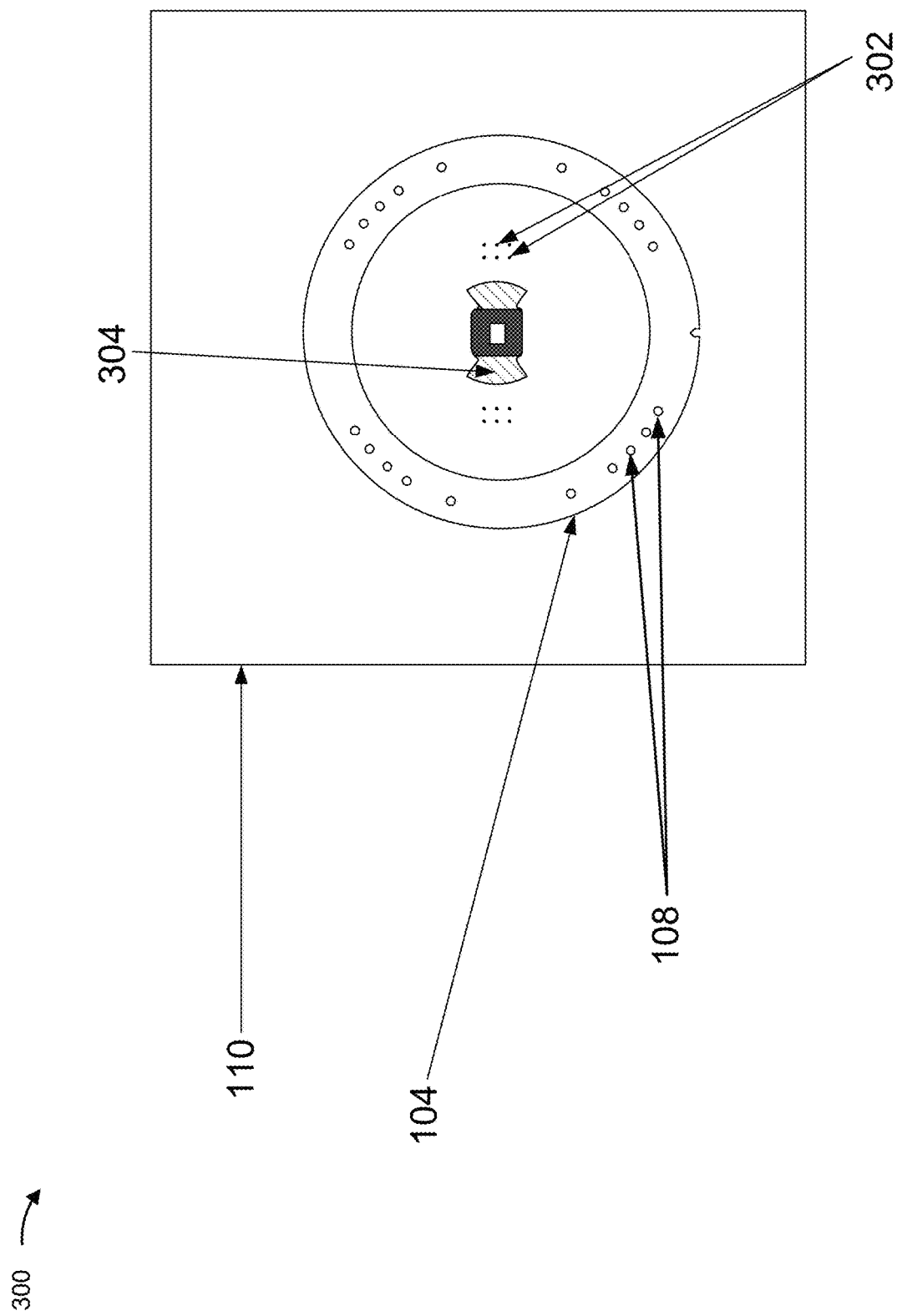

FIG. 3 is a diagram of a bottom-up view of an example implementation of a wafer prober 300 (e.g., a wafer testing system or apparatus) configured to test a wafer 102. As shown in FIG. 3, the wafer prober 300 may include a wafer carrier 104 (that may be disposed on a chuck 106, not shown) that includes one or more contact features 108, and a cathode plate 110 configured to be disposed on the one or more contact features 108 of the wafer carrier 104 (e.g., when the chuck 106 lifts the wafer 102 to be tested). A probe card 112 (not shown) may be disposed on the cathode plate 110.

As shown in FIG. 3, the cathode plate 110 may include one or more holes 302 to allow one or more low inductance electrical connectors (e.g., one or more low inductance strip lines) to connect the cathode plate 110 and the probe card 112 (e.g., to mount the probe card 112 to the cathode plate 110). An electrical connector may be considered low inductance when an inductance associated with the electrical connector satisfies (e.g., is less than) a low inductance threshold.

As further shown in FIG. 3, the cathode plate 110 may include an opening 304 to allow one or more probes 116 of the probe card 112 to pass through the cathode plate 110 and access the wafer 102 when the wafer is on the wafer carrier 104. The opening 304 may have a circular shape, a polygonal shape, or any other shape to facilitate the one or more probes 116 accessing one or more dies of the wafer 102. For example, as shown in FIG. 3, the opening 304 may have a "butterfly" shape to facilitate access to one or more dies of the wafer 102 by the one or more probes 116.

The one or more contact features 108 may be positioned in an arrangement to facilitate providing one or more electrical paths from the wafer carrier 104 to the probe card 112 via the cathode plate 110. For example, as shown in FIG. 3, the one or more contact features 108 may be positioned in a circular arrangement (e.g., along an outer portion of the wafer carrier 104). Other arrangements are also contemplated, such as a polygonal shaped arrangement or any other shaped arrangement. The arrangement may allow the wafer 102, the wafer carrier 104, and/or the chuck 106 to freely move when testing the wafer 102, without being inhibited by or coming into contact with one or more other components of the wafer prober 300 (e.g., vacuum hoses, mounting brackets, and/or the like).

As indicated above, FIG. 3 is provided merely as an example. Other examples may differ from what is described with regard to FIG. 3.

Figure 4:
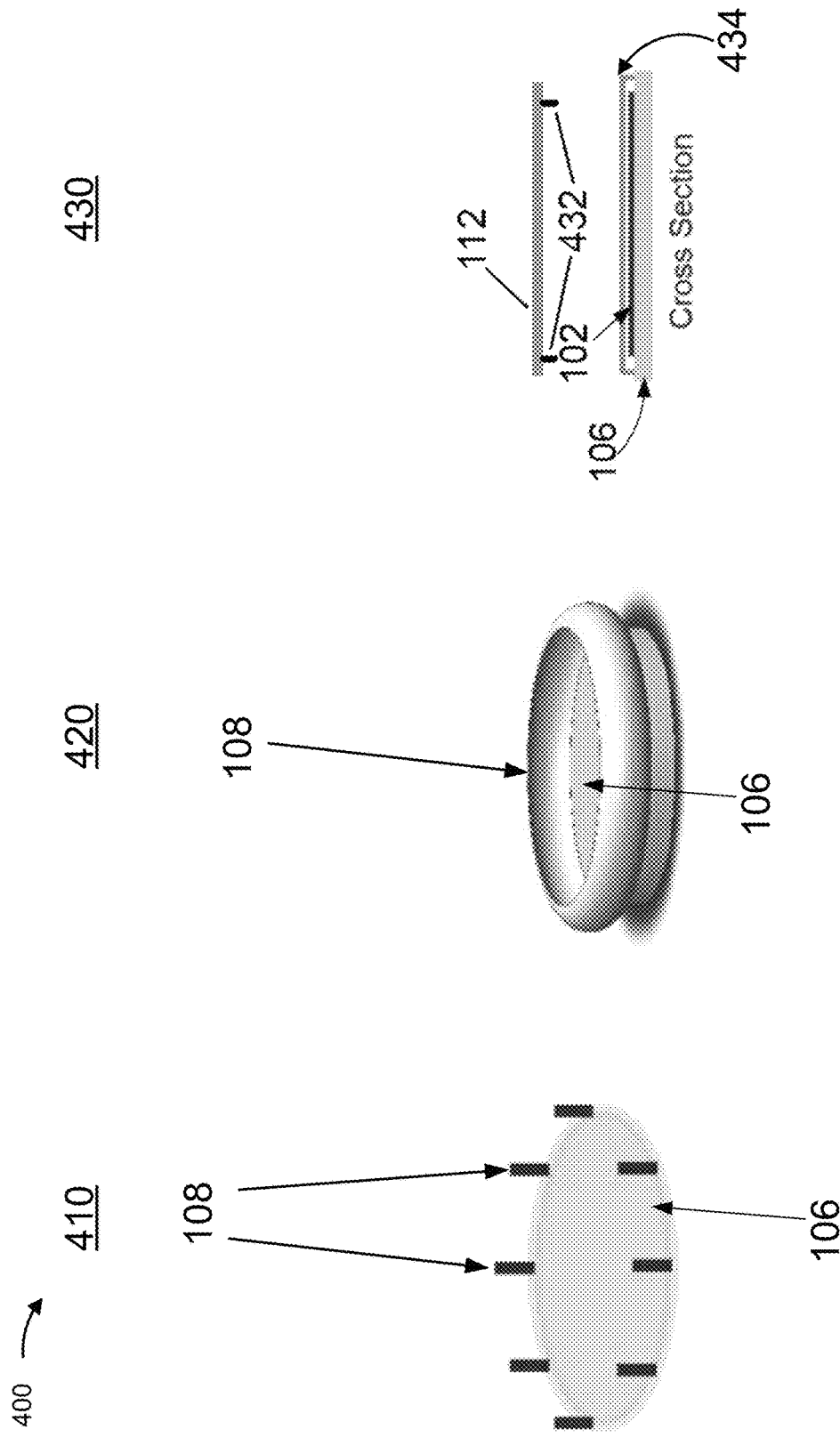
FIG. 4 is a diagram illustrating additional example implementations described herein.

FIG. 4 is a diagram 400 illustrating additional example implementations associated with the wafer probers (e.g., wafer prober 100, wafer prober 200, and/or wafer prober 300) described herein. As shown in FIG. 4, an example implementation 410 may include a chuck 106 that includes one or more contact features 108. Accordingly, the chuck 106 may be configured to directly hold the wafer 102 (e.g., without a wafer carrier 104), which may simplify the design of a wafer prober that includes the chuck 106. The one or more contact features 108 may be configured in a similar manner as that described above (e.g., when the one or more contact features 108 are part of a wafer carrier 104).

As further shown in FIG. 4, an example implementation 420 may include a chuck 106 that includes a single, monolithic contact feature 108 (e.g., shown in FIG. 4 as a torus shaped contact feature 108). Such a contact feature 108 may provide a large surface area for contacting a cathode plate 110, which may minimize an inductance associated with the contact feature 108. This may allow an electrical pulse generated by a driver 118 of a probe card 112 (e.g., that is electrically connected to the chuck 106 via the contact feature 108) to generate nanosecond pulses to test a wafer 102 associated with the chuck 106.

As further shown in FIG. 4, an example implementation 430 may include a chuck extension plate 434 electrically connected to the chuck 106 around its perimeter. In this case, the probe card will include one or more contact features 432 (e.g., that are similar to the one or more contact features 108 of the wafer carrier 104 described above) that are disposed on a probe card 112 when a wafer 102 (e.g., that is disposed on the chuck 106) is to be tested. As shown in FIG. 4, the chuck extension plate 434 may cover a portion of the wafer 102 and/or the chuck 106 to allow the probe card 112 to test the portion of the wafer 102. The chuck 106 may incrementally reposition the wafer 102 to allow the probe card 112 to test one or more other portions of the wafer 102.

As indicated above, FIG. 4 is provided merely as an example. Other examples may differ from what is described with regard to FIG. 4.

Figure 5:
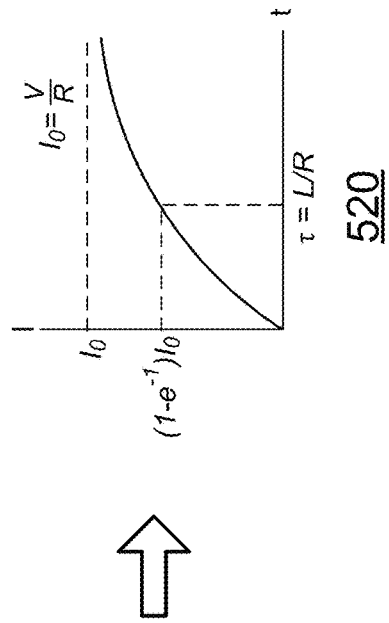
FIG. 5 is a diagram illustrating an example circuit with resistance and self-inductance.
Figure 5:
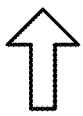
Figure 5:
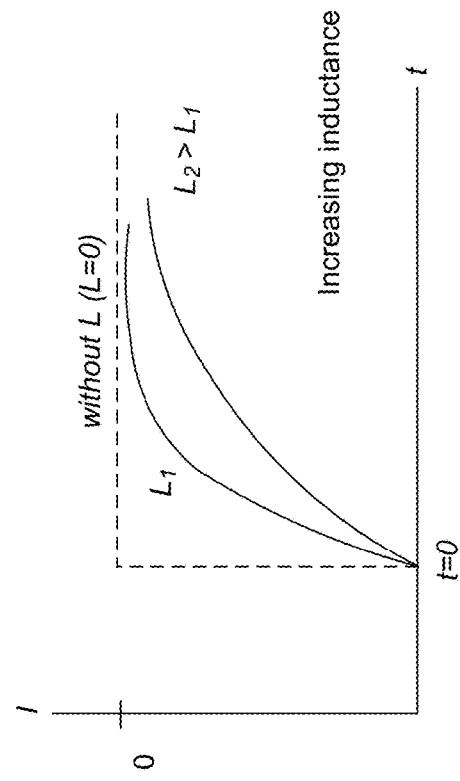
Figure 5:
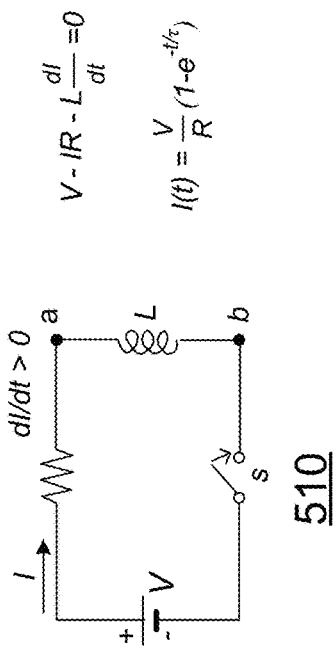

FIG. 5 is a diagram 500 illustrating an example circuit 510 with resistance, R, and self-inductance, L (also referred to as an RL circuit). As shown in FIG. 5, the example circuit 510 consists of a voltage source V, a resistor R, an inductor L, and a switch s. When s is closed, an electromotive force (EMF), $$L\frac{dI}{dt},$$

is generated by a time-varying magnetic field induced by a current I flowing through the inductor L. This EMF is an induced voltage, which counteracts the source voltage V and slows the current flow during a transient stage. The example circuit 510 represents the transmission path 120 of the wafer probers (e.g., wafer prober 100, wafer prober 200, and/or wafer prober 300) described herein.

Based on Faraday's law, the current I does not immediately rise, because the inductor L produces an induced EMF that counteracts the increase in the current I. This can be represented by the following equation:

$$I(t) = \frac{V}{R}\left(1 - e^{-\frac{t}{\tau}}\right), \text{ where } t = \text{time,}$$

$$\text{and } \tau = \frac{L}{R}.$$

As shown in plot 520 of I(t), the current I starts at zero and increases asymptotically to a final value $I_0$, where $$I_0 = \frac{V}{R}.$$

Accordingly, the time required for the current I to rise from 0 to $I_0$ depends on an amount of inductance of the inductor L. As shown in plot 530, the time required for the current I to rise from 0 to $I_0$ with a first inductor with inductance L1 is shorter than the time required for the current I to rise from 0 to $I_0$ with a second inductor with inductance L2, where L2>L1. Rise time is directly proportional to parasitic inductance, L, of the probing circuit.

In some implementations, a minimum pulse width of an electrical pulse generated by the driver 118 (e.g., as described herein) is about two times the time required for the current I to rise from 0 to $I_0$. Accordingly, some implementations described herein provide a low inductance transmission path 120, from the wafer carrier 104 to the probe card 112 and/or the driver 118, which facilitates the driver 118 being able to generate electrical pulses with nanosecond pulse widths.

As indicated above, FIG. 5 is provided merely as an example. Other examples may differ from what is described with regard to FIG. 5.

Figure 6:
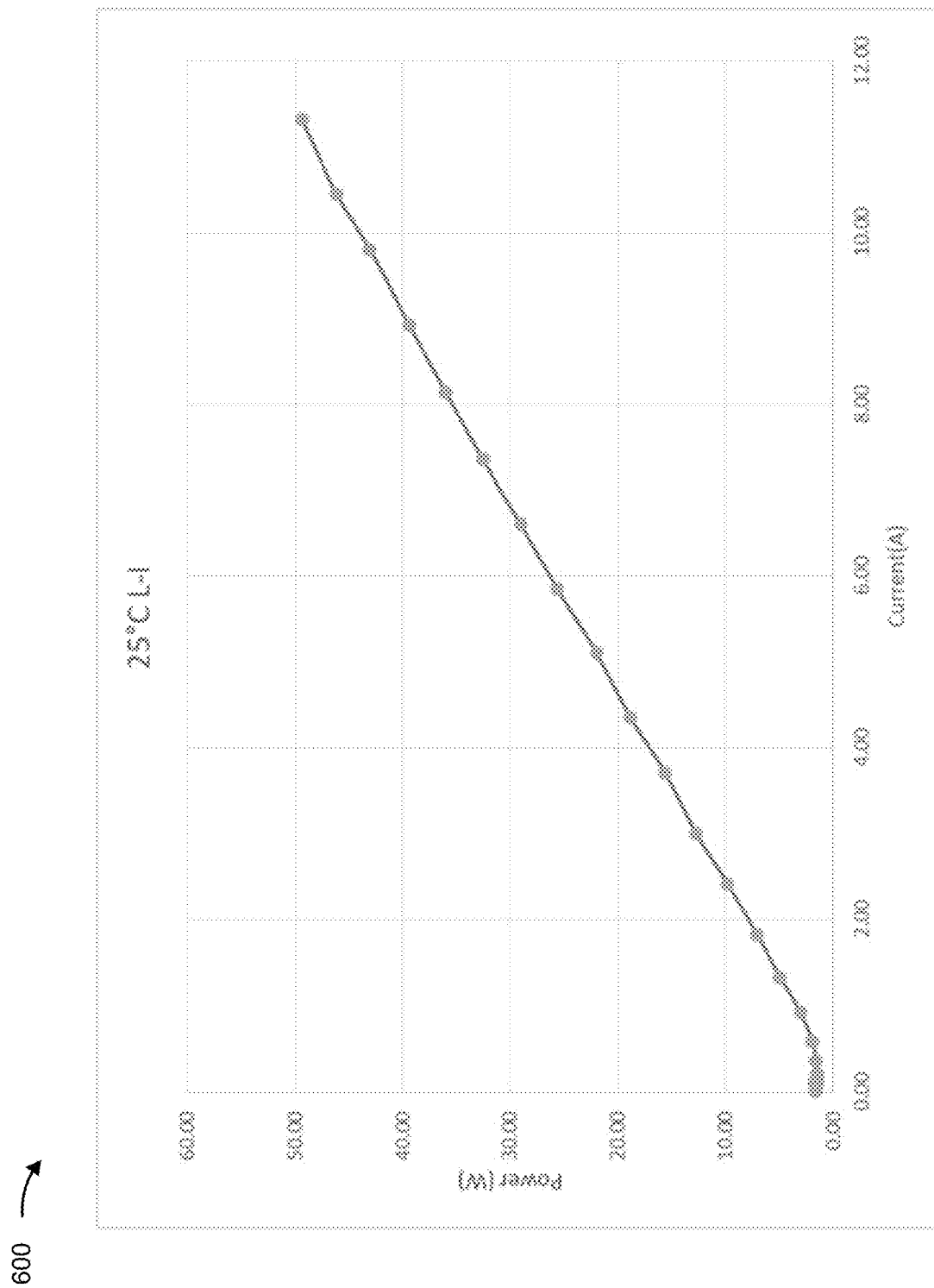
FIG. 6 is a plot illustrating a relationship between drive current and optical power of a VCSEL array die measured using current pulses generated by a wafer prober described herein.

FIG. 6 is a plot 600 illustrating a relationship between drive current and optical power of a VCSEL array die measured using current pulses generated by the driver 118 described herein. Due to the low inductance transmission path 120, the driver 118 is able to generate nanosecond electrical pulses using a particular amount of current to produce a particular amount of power. As shown in plot 600, the relationship between current and power is positive for a particular pulse width of an electrical pulse generated by the driver 118 for a range of currents (e.g., shown as 0 amps to 11 amps). As indicated above, FIG. 6 is provided merely as an example. Other examples may differ from what is described with regard to FIG. 6.

The foregoing disclosure provides illustration and description, but is not intended to be exhaustive or to limit the implementations to the precise form disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, etc., depending on the context.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A wafer testing system, comprising:
    a chuck configured to hold a wafer carrier;
    the wafer carrier configured to hold a wafer on a surface of the wafer carrier to allow the wafer to be tested by one or more probes associated with a probe card of the wafer testing system,
        wherein the surface of the wafer carrier comprises one or more contact features protruding from the surface of the wafer carrier;
    a cathode plate configured to provide an electrical connection between the wafer carrier and the probe card when the one or more probes associated with the probe card test the wafer,
        wherein a portion of a surface of the cathode plate is configured to be disposed on the one or more contact features of the wafer carrier when the one or more probes associated with the probe card test the wafer; and
    the probe card configured to test, using the one or more probes associated with the probe card, the wafer when the wafer is on the surface of the wafer carrier,
        wherein a portion of a surface of the probe card is disposed on a portion of an additional surface of the cathode plate.

2. The wafer testing system of claim 1, wherein the one or more contact features protruding from the surface of the wafer carrier comprises at least one of:
    one or more contact pins;
    a circular contact connector; or
    a polygonal contact connector.

3. The wafer testing system of claim 1, wherein the wafer testing system provides at least one electrical path from the wafer carrier to the probe card via the cathode plate,
    wherein an inductance value associated with the at least one electrical path satisfies a threshold.

4. The wafer testing system of claim 1, wherein the cathode plate is configured to provide an electrical connection between the probe card and the cathode plate when the portion of the surface of the probe card is disposed on the portion of the additional surface of the cathode plate,
    wherein the cathode plate is configured to provide an electrical connection between the wafer carrier and the cathode plate when the portion of the surface of the cathode plate is disposed on the one or more contact features of the wafer carrier.

5. The wafer testing system of claim 1, wherein the cathode plate includes an opening for the one or more probes associated with the probe card to pass through the cathode plate to test the wafer when the wafer is disposed on the surface of the wafer carrier.

6. The wafer testing system of claim 1, wherein the cathode plate is electrically connected to the probe card via at least one electrical connector,
    wherein an inductance associated with the at least one electrical connector satisfies a threshold.

7. The wafer testing system of claim 1, wherein the chuck is configured to move to a particular position to allow the wafer, when disposed on the wafer carrier, to be tested by the one or more probes associated with the probe card, wherein the one or more contact features are configured to contact the portion of the surface of the cathode plate when the chuck is in the particular position.

8. The wafer testing system of claim 1, wherein the probe card is configured to generate a nanosecond pulse to test the wafer,
wherein the nanosecond pulse is to transmit from the probe card to the wafer, to the wafer carrier, to the one or more contact features of the wafer carrier, to the cathode plate, and to the probe card.

9. The wafer testing system of claim 8, wherein a current associated with the nanosecond pulse satisfies a threshold.

10. A wafer prober, comprising:
a wafer carrier,
wherein the wafer carrier is configured to hold a wafer to be tested by the wafer prober on a surface of the wafer carrier,
wherein the surface of the wafer carrier comprises one or more contact features protruding from the surface of the wafer carrier;
a cathode plate,
wherein the cathode plate is configured to be disposed on the one or more contact features of the wafer carrier when the wafer is tested,
wherein the cathode plate includes one or more connectors that connect the cathode plate to a probe card; and
the probe card,
wherein the probe card is configured to test the wafer when the wafer is on the surface of the wafer carrier,
wherein a driver of the probe card is electrically connected, when the wafer is to be tested, to the wafer carrier via the one or more contact features of the wafer carrier, the cathode plate, and the one or more connectors that connect the cathode plate to the driver of the probe card.

11. The wafer prober of claim 10, wherein the one or more contact features are positioned in a circular arrangement on the surface of the wafer carrier.

12. The wafer prober of claim 10, wherein the one or more contact features comprise one or more compliant electrical connectors.

13. The wafer prober of claim 10, wherein the cathode plate includes one or more holes,
wherein the one or more holes are configured to allow one or more electrical connectors to connect the cathode plate to the probe card,
wherein an inductance associated with the one or more electrical connectors satisfies a threshold.

14. The wafer prober of claim 10, wherein the driver is configured to generate one or more nanosecond pulses to test the wafer.

15. The wafer prober of claim 14, wherein a transmission path of a nanosecond pulse, of the one or more nanosecond pulses, generated by the driver includes transmission from the driver, to the probe card, to a probe of the probe card, to a die of the wafer, to the wafer carrier, to the one or more contact features of the wafer carrier, to the cathode plate, and to the probe card.

16. The wafer prober of claim 14, wherein an amount of power associated with a nanosecond pulse, of the one or more nanosecond pulses generated by the driver, satisfies a threshold.

17. A wafer testing apparatus, comprising:
a chuck configured to hold a wafer on a surface of the chuck to allow the wafer to be tested by a probe card,
wherein the surface of the chuck comprises one or more contact features protruding from the surface of the chuck; and
a cathode plate configured to provide an electrical connection between the chuck and the probe card,
wherein the cathode plate is configured to contact the one or more contact features of the chuck when the wafer is to be tested by the probe card,
wherein the cathode plate includes one or more electrical connectors configured to connect the cathode plate to the probe card, and
wherein the chuck is to be electrically connected to the probe card via the one or more contact features of the chuck, the cathode plate, and the one or more electrical connectors when the cathode plate contacts the one or more contact features of the chuck and the cathode plate connects to the probe card via the one or more electrical connectors.

18. The wafer testing apparatus of claim 17, wherein the cathode plate includes an opening for one or more probes associated with the probe card to pass through the cathode plate to test the wafer when the wafer is held on the surface of the chuck.

19. The wafer testing apparatus of claim 17, wherein the chuck is configured to allow an electrical pulse generated by the probe card that transmits to the chuck to transmit to the one or more contact features of the chuck,
wherein the one or more contact features of the chuck are configured to transmit the electrical pulse to the cathode plate,
wherein the cathode plate is configured to transmit the electrical pulse to the one or more electrical connectors of the cathode plate, and
wherein the one or more electrical connectors of the cathode plate are configured to transmit the electrical pulse to the probe card.

20. The wafer testing apparatus of claim 17, wherein the one or more contact features of the chuck are associated with an inductance that satisfies a threshold.

* * * * *